United States Patent

Hirano et al.

[11] Patent Number: 5,871,883
[45] Date of Patent: Feb. 16, 1999

[54] LITHOGRAPHIC PRINTING PLATE PRECURSOR REQUIRING NO FOUNTAIN SOLUTION

[75] Inventors: Tsumoru Hirano; Toshifumi Inno, both of Shizuoka, Japan

[73] Assignee: Fuji Photo Film Co., Ltd., Kanagawa, Japan

[21] Appl. No.: 757,814

[22] Filed: Nov. 27, 1996

[30]     Foreign Application Priority Data

Nov. 27, 1995 [JP] Japan ..................................... 7-307533

[51] Int. Cl.⁶ .............................. G03F 7/00; G03F 7/004; B41C 1/55; B41N 1/14
[52] U.S. Cl. ......................................... 430/272.1; 430/303
[58] Field of Search .................................. 430/272.1, 303

[56]           References Cited

U.S. PATENT DOCUMENTS 4,874,686  10/1989  Urabe et al. ........................ 430/272.1
5,059,511  10/1991  Higashi et al. ...................... 430/272.1
5,353,705  10/1994  Lewis et al. ............................. 101/453
5,378,580   1/1995  Leenders ................................. 430/303
5,721,087   2/1998  Yokoya et al. .......................... 430/303

*Primary Examiner*—Cynthia Hamilton
*Attorney, Agent, or Firm*—Sughrue, Mion, Zinn, Macpeak & Seas, PLLC

[57]           ABSTRACT

A lithographic printing plate precursor requiring no fountain solution possible to conduct heat mode recording by a laser beam and excellent in image reproducibility and scratch resistance, which comprises a support having provided thereon a light-heat conversion layer containing a compound converting a laser beam to heat and a silicone rubber layer in this order, wherein the light-heat conversion layer contains an addition polymer having a group capable of reacting with a silicone crosslinking agent at a side chain thereof, and the addition polymer reacts with a silicone crosslinking agent contained in the silicone rubber layer when the silicone rubber layer is formed by coating and drying.

4 Claims, No Drawings

LITHOGRAPHIC PRINTING PLATE PRECURSOR REQUIRING NO FOUNTAIN SOLUTION

FIELD OF THE INVENTION

The present invention relates to a lithographic printing plate precursor for preparing a lithographic printing plate requiring no fountain solution (hereinafter also referred to as a waterless printing plate), and more particularly to a lithographic printing plate precursor in which heat mode recording by a laser beam is possible, and which is good in scratch resistance and image reproducibility.

BACKGROUND OF THE INVENTION

The conventional printing systems requiring fountain solutions have the serious problem that ink is emulsified or the fountain solutions are contaminated with ink because of difficulty of delicately controlling a balance between the fountain solutions and ink, resulting in poor ink density or generation of background scum to cause broke. In contrast, the waterless printing plates have many advantages because no fountain solutions are required. As to such waterless printing plates for conducting lithographic printing without use of the fountain solutions, various kinds of plates are proposed, for example, in JP-B-44-23042 (the term "JP-B" as used herein means an "examined Japanese patent publication"), JP-B-46-16044, JP-B-54-26923, JP-B-56-14976, JP-B-56-23150, JP-B-61-54222, JP-A-58-215411 (the term "JP-A" as used herein means an "unexamined published Japanese patent application"), JP-A-2-16561 and JP-A-2-236550. In particular, a waterless printing plate has very excellent characteristics, which comprises a support having provided thereon a primer layer, a photopolymerizable light-heat conversion layer and a silicone rubber layer in this order, wherein exposure polymerizes and hardens the photopolymerizable light-heat conversion layer to strengthen adhesion of the exposed area of the light-heat conversion layer to the silicone rubber layer, and development removes only the unexposed area of the silicone rubber layer, thereby forming an image area.

On the other hand, with the recent rigid progress in prepress systems and output systems such as image setters and laser printers, methods for obtaining printing plates by converting printing images to digital data, and using new prepress processing systems such as computer-to-plate and computer-to-cylinder systems have been proposed. Accordingly, new types of printing materials for these printing systems have been desired, and the development thereof is proceeding. However, although many conventional lithographic printing plates using fountain solutions have been provided for these techniques, waterless printing plates are scarcely known.

Formation of waterless printing plates by laser beam writing is described, for example, in JB-B-42-21879, JP-A-50-158405, JP-A-6-55723, JP-A-6-186750, U.S. Pat. No. 5,353,705 and PCT International Publication No. WO-9401280. These references describe that an ink-repellent silicone rubber layer is provided on a light-heat conversion layer containing a laser beam absorber such as carbon black and a self-oxidizing binder such as nitrocellulose, the ink-repellent silicone layer is partially removed by laser beam irradiation to form an ink-receiving area, thereby conducting waterless printing. However, in these methods, the removal of the silicone rubber layer depends on ablation of the light-heat conversion layer by laser beam irradiation, so that the linearity of thin lines and the circularity of halftone dots become poor, resulting in unsatisfactory printing images. Accordingly, an improvement thereof has been strongly desired. Further, they have the disadvantage fatal to the printing plates that they are easily scratched in treating the printing plates and in printing because of weak adhesion between the light-heat conversion layers and the silicone rubber layers, and ink adheres to the resulting scratches to form image areas. Some references disclose addition of a silane coupling agent to the silicone rubber layer to compensate for this disadvantage. However, it is insufficient to enhance the adhesion between the light-heat conversion layer and the silicone rubber layer, and the scratch resistance is little improved.

SUMMARY OF THE INVENTION

An object of the present invention is to provide a lithographic printing plate precursor requiring no fountain solution writable with a laser and good in image reproducibility and scratch resistance.

The present inventors have conducted intensive investigation of waterless printing plate precursors. As a result, the above-mentioned object has been attained by a lithographic printing plate precursor requiring no fountain solution comprising a support having provided thereon a light-heat conversion layer containing a compound converting a laser beam to heat and a silicone rubber layer in this order, wherein the light-heat conversion layer contains an addition polymer having a group capable of reacting with a silicone crosslinking agent at a side chain thereof, and the polymer reacts with a silicone crosslinking agent contained in the silicone rubber layer when the silicone rubber layer is formed by coating and drying.

The addition polymer to be contained in the light-heat conversion layer, which has a group capable of reacting with the silicone crosslinking agent contained in the silicone rubber layer at a side chain thereof, reacts with the silicone crosslinking agent contained in the silicone rubber layer in forming the silicone rubber layer and drying it to form a covalent bond. The light-heat conversion layer is therefore bonded to the silicone rubber layer very strongly. Although the cause of an improvement in image reproducibility is not clear yet, an improvement in scratch resistance is considered to be caused by an enhancement in adhesion between the silicone rubber layer and the light-heat conversion layer.

DETAILED DESCRIPTION OF THE INVENTION

The present invention will be described in detail below.

The crosslinked silicone rubber layer which can be used in the present invention is a film formed by curing the following composition A (condensation type silicone) or B (addition type silicone):

| Composition A: | |
|---|---|
| (a) Diorganopolysiloxanw (number average molecular weight: 3,000 to 40,000) | 100 parts by weight |
| (b) Condensation Type Crosslinking Agent | 3 to 70 part by weight |
| (c) Catalyst | 0.01 to 40 parts by weight |

The above-mentioned component (a), the diorganopolysiloxane, is a polymer having repeating units represented by the following formula (A):

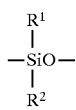

wherein $R^1$ and $R^2$ each represented an alkyl group having 1 to 10 carbon atoms, an alkenyl group having 2 to 10 carbon atoms (preferably a vinyl group), or an aryl group having 6 to 20 carbon atoms. They may have other appropriate substituents(s). In general, it is preferred that 60% or more of $R^1$ or $R^2$ are a methyl group, a vinyl halide group, or a phenyl halide group.

It is preferred that such a diorganopolysiloxane has hydroxyl group at both ends thereof.

The above-mentioned component (a) generally has a number average molecular weight of 3,000 to 40,000, and preferably 5,000 to 36,000.

The component (b) may be any as long as it is of the condensation type, but a compound represented by the following formula is preferred:

$$R^1{}_m \cdot Si \cdot X_n \; (m+n=4, n \text{ is 2 or more})$$

wherein $R^1$ has the same meaning as $R^1$ described in formula (A) above, and X is the following substituent:

(i) a halogen atom such as Cl, Br or I, or (ii) H, —OH or an organic substituent such as —OCOR³, —OR³, —O—N=C(R⁴)R⁵ or —N(R⁴)R⁵, wherein R³ is an alkyl group having 1 to 10 carbon atoms or an aryl group having 6 to 20 carbon atoms, and R⁴ and R⁵ each are an alkyl group having 1 to 10 carbon atoms.

The component (c) is a known catalyst such as a carboxylate of a metal such as tin, zinc, lead, calcium or manganese, for example, dibutyl laurate, lead octylate or lead naphthenate, or chloroplatinic acid.

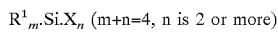

| Composition B: | |
|---|---|
| (d) Diorganopolysiloxane Having Addition Reactive Functional Groups (number average molecular weight: 3,000 to 40,000) | 100 parts by weight |
| (e) Organohydrogenpolysiloxane (crosslinking agent) | 0.1 to 10 parts by weight |
| (f) Addition Catalyst | 0.00001 to 1 part by weight |

The above-mentioned component (d), the diorganopolysiloxane having addition reactive functional groups, is an organopolysiloxane (having a number average molecular weight of 3,000 to 40,000) having at least two alkenyl groups (preferably, vinyl groups) each having 2 to 10 carbon atoms in a molecule, the alkenyl groups being directly bonded to silicon atoms. The alkenyl group may be positioned either at ends of the molecule or at intermediate portions thereof. The component (d) may have an unsubstituted or substituted alkyl group each having 1 to 10 carbon atoms or an unsubstituted or substituted aryl group each having 6 to 20 carbon atoms, as an organic group other than the alkenyl group. Further, the component (d) may also contain hydroxyl groups in a slight amount. The number average molecular weight of the component (d) is generally from 3,000 to 40,000, and more preferably from 5,000 to 36,000.

The component (e) includes, for example, polydimethylsiloxane having hydrogen atoms at both ends, α, ω-dimethylpolysiloxane, methylsiloxane-dimethylsiloxane copolymer having methyl groups at both ends, cyclic polymethylsiloxane, polymethylsiloxane having trimethylsilyl groups at both ends, and dimethylsiloxane-methylsiloxane copolymer having trimethylsilyl groups at both ends.

Although the component (f) is arbitrarily selected from known catalysts, a platinum compound is particularly preferred. Examples of the platinum compound include platinum, platinum chloride, chloroplatinic acid and olefin-coordinated platinum. In order to regulate the curing rate of the compositions, it is also possible to add a crosslinking restraining agent such as a vinyl group-containing organopolysiloxane (e.g., tetracyclo(methylvinyl)siloxane), a carbon-carbon triple bond—containing alcohol, acetone, methyl ethyl ketone, methanol, ethanol and propylene glycol monomethyl ether.

The silicone rubber layer may contain an inorganic fine powder such as silica, calcium carbonate and titanium oxide, an adhesive auxiliary such as a silane coupling agent, a titanate coupling agent and an aliminum coupling agent and/or a photopolymerization initiator, if necessary.

If the thickness of the silicone rubber layer is too thin, the ink repellency is decreased to cause easy development of scratches. On the other had, if the thickness is too thick, the image reproducibility is deteriorated. The thickness is therefore preferably 0.5 g/m² to 5 g/m² by dry weight, and more preferable 1 g/m² to 3 g/m².

In the waterless printing plate, various silicone layers may be further formed on the silicone rubber layer.

Further, for surface protection of the silicone rubber layer, the silicone rubber layer may be laminated with a transparent film such as polyethylene, polypropylene, polyvinyl chloride, polyvinylidene, chloride, polyvinyl alcohol, polyethylene terephthalate and cellophane films, or coated with a polymer thereof. These films may be a stretched one. Further, they may be subjected to surface matting processing, but films not subjected to matting processing are preferred in the present invention.

The light-heat conversion layer used in the present invention is a layer having the function of converting the laser beam used for writing to heat (light-heat conversion), and comprising at least (1) an addition polymer having a group capable of reacting with a silicone crosslinking agent contained in the silicone rubber layer at a side chain thereof and (2) a light-heat converting agent.

Component (1): Addition Polymer Having Group Reactable with Silicone Crosslinking Agent of Silicone Rubber Layer at Side Chain Thereof The addition polymer, which has a group reactable with the silicone crosslinking agent contained in the silicone rubber layer at side chains thereof, can be obtained by subjecting addition-polymerizable ethylenic unsaturated monomers having groups reactable with the silicone crosslinking agent contained in the silicone rubber layer to addition polymerization, or by introducing a group reactable with the silicone crosslinking agent contained in the silicone rubber layer into an addition polymer by the polymer reaction. It is preferred that the addition polymer has a weight average molecular weight of 1,000 to 1,000,000, more preferably from 3,000 to 500,000.

Preferred examples of repeating units having a group reactable with the silicone crosslinking agent contained in the silicone rubber layer at a side chain thereof include repeating units represented by formula (1):

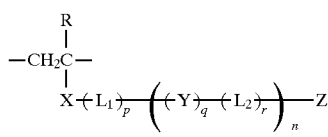

wherein R represents a hydrogen atom or a methyl group; X represents —COO—, —CONH—, or a phenylene group; Y represents —COO—, —OCO—, —CONH—, —NHCO—, —NHCOO—, —OCONH—, —O—, —S—, —NH— or a phenylene group; $L_1$ and $L_2$ each represents an unsubstituted or substituted alkylene group having 1 to 20 carbon atoms, and the substituent includes, for example, an alkyl group having 1 to 10 carbon atoms, an alkoxyl group having 1 to 10 carbon atoms, a phenyl group having 6 to 20 carbon atoms, a phenoxy group having 6 to 20 carbon atoms, a hydroxyl group, an amino group, a cyano group, a nitro group and a halogen atom; and Z represents a hydroxyl group, —CH=$CH_2$ or —C($CH_3$)=$CH_2$.

When the condensation reaction is used as the hardening reaction of the silicone rubber layer, Z is preferably a hydroxyl group, and when the addition reaction is used, Z is preferably —CH=$CH_2$ or —C($CH_3$)=$CH_2$. p, q and r each represents 0 or 1, and n represents an integer of 0 to 3.

Specific examples of the repeating units of the addition polymer, which has a group reactable with the silicone crosslinking agent contained in the silicone rubber layer at a side chain thereof, are shown below, but not limited thereto.

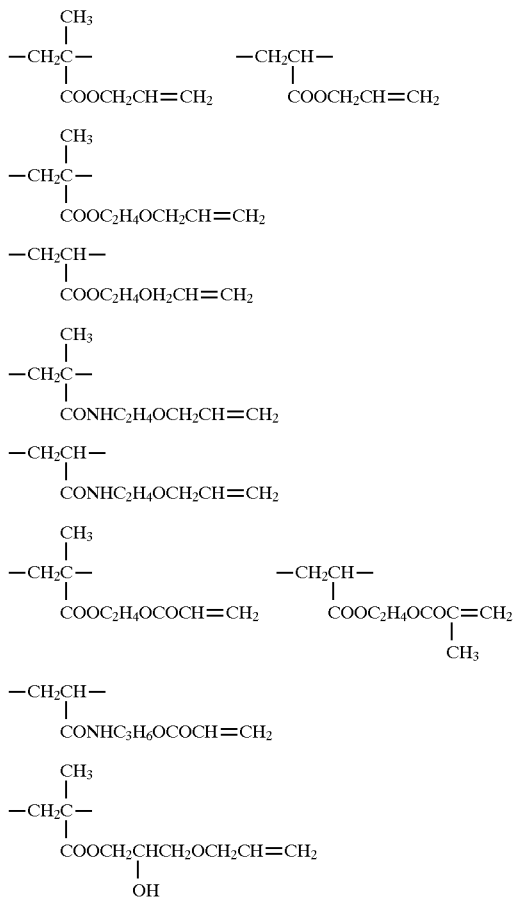

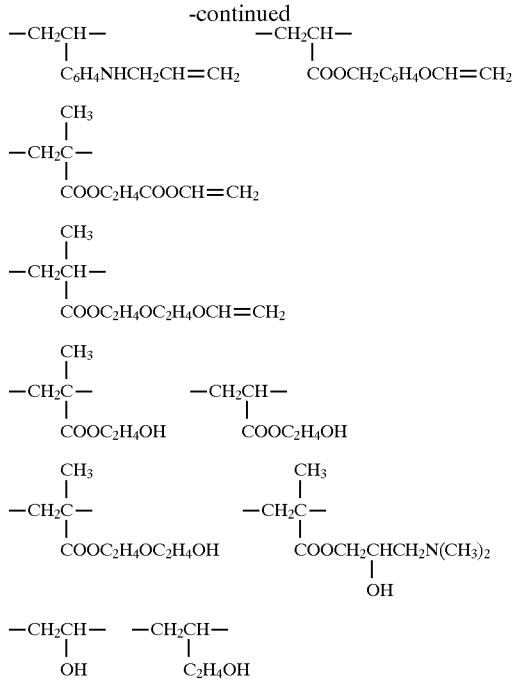

The addition polymer which has a group reactable with the silicone crosslinking agent contained in the silicone rubber layer at a side chain thereof, may have two or more kinds of repeating units having a group reactable with the silicone crosslinking agent at a side chain thereof, and may be a copolymer with repeating units not having any group reactable with the silicone crosslinking agent. There is no particular limitation on compounds used for copolymerization, as long as they are addition-polymerizable ethylenic unsaturated monomers. The polymer reacts with a silicone crosslinking agent contained in the silicone rubber layer when the silicone rubber layer is formed by coating and drying, for example, at a temperature of 50° to 180° C., preferably from 80° to 150° C.

The addition polymer can be used generally in an amount of 20% to 70% by weight based on the weight of the total solid content of the light-heat conversion layer, preferably in an amount of 25% to 60% by weight, and more preferably in an amount of 30% to 50% by weight.

Examples of the light-heat converting agent include the organic pigments, organic dyes, metal and metal oxide. Examples of the organic pigment include various carbon black such as acidic carbon black, basic carbon black and neutral carbon black, various carbon black surface-modified or surface-coated for improvements in dispersibility, etc., and Nigrosine pigments. Examples of the organic dye include various compounds described in Matsuoka, *Infrared Sensitizing Dyes*, Plenum Press, New York, N.Y. (1990), U.S. Pat. No. 4,833,124, EP-321923, U.S. Pat. Nos. 4,772, 583, 4,942,141, 4,948,776, 4,948,777, 4,948,778, 4,950,639, 4,912,083, 4,952,552 and 5,023,229. Examples of the metal and metal oxide include aluminum, indium-tin oxides, tungsten oxide, manganese oxide and titanium oxide. In addition, conductive polymers such as polypyrroles and polyanilines can also be used.

The amount of the light-heat converting agent is generally from 5 to 50% by weight, preferably from 8 to 45% by weight, more preferably from 10 to 40% by weight based on the weight of the total solid content of the light-heat conversion layer.

In the present invention, high molecular compounds having film-forming property besides the polymer of component (1) may be added. Examples of the high molecular weight compound which may be incorporated in the light-heat conversion layer include cellulose, cellulose derivatives such as nitrocellulose and ethyl cellulose, monopolymers and copolymers of acrylates and methacrylates such as polymethyl methacrylate and polybutyl methacrylate, homopolymers and copolymers of styrenic monomers such as polystyrene and poly($\alpha$-methylstyrene), various synthetic rubbers such as isoprene and styrene-butadiene, homopolymers of vinyl esters such as polyvinyl acetate, copolymers thereof such as vinyl acetate-vinyl chloride copolymers, various condensation polymers such as polyureas, polyurethanes, polyesters and polycarbonates, and binders used in so-called "chemical amplification systems" described in Frechet et al., *J. Imaging Sci.,* 30(2), pp. 59–64 (1986), Ito and Willson, *Polymers in Electronics (Symposium Series)*, 242, p. 11, T. Davidson, Ed., ACS Washington, D.C. (1984) and E. Reichmanis and L. F. Thompson, *Microelectronic Engineering*, 13, pp. 3–10 (1991).

The amount of such a high molecular weight compound is generally from 0 to 50% by weight, preferably from 10 to 40% by weight, more preferably from 15 to 35% by weight based on the weight of the total solid content of the light-heat conversion layer.

Other additives are added according to various purposes such as improvement in laser recording sensitivity of the light-heat conversion layer, improvement in dispersibility of dispersion contained in the light-heat conversion layers and improvement in adhesion of the light-heat conversion layer to an adjacent layer such as the support or the primer layer.

For example, in order to improve the laser recording sensitivity, it is considered to add known compounds decomposing by heating to generate gases. In this case, the laser recording sensitivity can be improved by sudden expansion of the light-heat conversion layer. Examples of these additives include azidodicarbonamide, sulfonyl hydrazine and dinitrosopentamethylenetetraamine.

Further, known compounds which are decomposed by heating to produce acidic compounds can be used as an additive. The use of such a compound in combination with the binder in the chemical amplification system can greatly lower the decomposition temperature of constituent substances of the light-heat conversion layer, resulting in an improvement in the sensitivity of laser recording. Example of the compound include various kinds of iodonium salts, sulfonium salts, phosphonium tosylates, oxime sulfonates, dicarbodiimide sulfonates and triazines.

When a pigment such as carbon black is used as the light-heat conversion agent, the degree of dispersion of the pigment sometimes affects the sensitivity of laser recording. Various pigment dispersing agents are therefore used as an additive.

In order to improve the adhesive property, known adhesion improvers (for example, a silane coupling agent and a titanate coupling agent) may be added.

Besides, various additives such as a surfactant for improving the coating properties can be used if necessary.

The above-mentioned composition for the light-heat conversion layer can be dissolved in an appropriate solvent alone or in combination of two or more, such as 2-methoxyethanol, 2-methoxyethyl acetate, propylene glycol methyl ethyl acetate, methyl lactate, ethyl lactate, propylene glycol monomethyl ether, ethanol, methyl ethyl ketone, N,N-dimethylformamide, N,N-dimethylacetamide, tetrahydrofuran and dioxene, and applied onto substrates. The amount thereof coated is suitably 0.5 g/m$^2$ to 10 g/m$^2$ by weight after dried, and preferably 0.1 g/m$^2$ to 5 g/m$^2$. Too thick a film thickness of the light-heat conversion layer provides unfavorable results such as deterioration of the laser recording sensitivity.

The support used for the lithographic printing plate of the present invention is required to have such flexibility that the sheet can be set on an usual printer and to withstand the loading imposed in printing at the same time. Accordingly, typical examples of the support include plates of metals such as aluminum, plates of aluminum alloys (alloys of aluminum and metals such as silicon, copper, manganese, magnesium, chromium, zinc, lead, bismuth and nickel), films of plastics such as polyethylene terephthalate and polyethylene naphthalate, and composite sheets laminated with paper or plastic films such as polyethylene and polypropylene films.

The film thickness of the support is generally from 25 $\mu$m to 3 mm, and preferably from 75 $\mu$m to 500 $\mu$m. However, the optimum thickness varies depending on the kind of support and the printing conditions used. In general, it is most preferably from 100 $\mu$m to 300 $\mu$m.

In the present invention, a primer layer may be formed between the support and light-heat conversion layer. Various primer layers can be used in order to improve the adhesive property between the support and light-heat conversion layer or printing properties. Examples of the primer layer which can be used in the present invention include layers of various photosensitive polymers exposed to cure them before lamination of the photosensitive resin layer as disclosed in JP-A-60-22903, a heat-cured epoxy resin layer disclosed in JP-A-62-50760, a cured gelatin layer as disclosed in JP-A-63-133151, a layer formed by use of an urethane resin and a silane coupling agent as disclosed in JP-A-3-200965, and an urethane resin layer as disclosed in JP-A-3-273248. In addition, a cured gelatin or casein layer is also effective. For the purpose of making the primer layer flexible, a polymer having a glass transition temperature of room temperature or less, such as polyurethanes, polyamides, styrene/butadiene rubber, carboxy-modified styrene/butadiene rubber, acrylonitrile/butadiene rubber, carboxy-modified acrylonitrile/butadiene rubber, polyisoprene, acrylate rubber, polyethylene, chlorinated polyethylene and chlorinated polypropylene, may be added to the above-mentioned primer layer. They may be added in any amount, and the primer layer may be formed by the additive alone as long as the film layer can be formed. For the above-mentioned purpose, an additive such as adhesive auxiliaries (for example, a polymerizable monomer, a diazo resin, a silane coupling agent, a titanate coupling agent and an aluminum coupling agent), a pigment, silica powder, and titanium oxide can be also added to the primer layer. Further, the primer layer may be cured by exposure after coating.

In general, the coated amount of the primer layer is from 0.1 g/m$^2$ to 10 g/m$^2$ by dry weight, preferably from 0.3 g/m$^2$ to 8 g/m$^2$, and more preferably from 0.5 g/m$^2$ to 5 g/m$^2$.

In the present invention, the laser beam energy used for recording is absorbed by the light-heat conversion layer of the waterless printing plate precursor or the present invention, and converted to the heat energy, thereby resulting in deterioration of the adhesive property between the light-heat conversion layer and the silicone rubber layer by reactions and physical changes such as combustion, fusion, decomposition, vaporization and explosion.

In the present invention, laser beam is used for exposure of the waterless printing plate precursor. There is no particular limitation on the laser used, as long as it gives the exposure necessary for reduction in the adhesive property sufficient for removal of the silicone rubber layer by separation. Such a laser include gas lasers such as an Ar laser and a carbon dioxide laser, solid lasers such as an YAG laser, and semiconductor lasers. Usually, lasers having an output of 50 mW or more are required. From the practical points of view of maintenance, cost, etc., the semiconductor lasers and semiconductor-excited solid lasers (the YAG laser, etc.) are preferably used.

The recording wavelength of these lasers are in the range of the wavelength of infrared rays, and an oscillation wavelength of from 800 nm to 1100 nm is frequently used.

The printing plate precursors may be subjected to laser exposure either without removal of the film for surface protection of the silicone rubber layer, or after removal thereof.

In the present invention, known developing solutions for waterless lithographic printing plates can be used as the developing solutions. However, water or aqueous solutions of water-soluble organic solvents mainly composed of water are preferably used from the viewpoint of safety. Taking into account safety and inflammability, the concentration of the water-soluble solvents is preferably less than 40% by weight. Examples of the known solvents include aliphatic hydrocarbons (such as hexane, heptane, "Isoper E, G, H" (manufactured by Esso Kagaku Co.), gasoline and kerosine), aromatic hydrocarbons (such as toluene and xylene), hydrocarbon halides (such as Trichlene) containing the following polar solvents and the polar solvents themselves.

Alcohols (methanol, ethanol, propanol, isopropanol, benzyl alcohol, ethylene glycol monomethyl ether, 2-ethoxyethanol, diethylene glycol monoethyl ether, diethylene glycol monohexyl ether, triethylene glycol monomethyl ether, propylene glycol monoethyl ether, dipropylene glycol monomethyl ether, polyethylene glycol monomethyl ether, polypropylene glycol, tetraethylene glycol, etc.)

Ketone (acetone, methyl ethyl ketone, etc.)

Esters (ethyl acetate, methyl lactate, butyl lactate, propylene glycol monomethyl ether acetate, diethylene glycol acetate, diethyl phthalate, etc.)

Others (triethyl phosphate, tricresyl phosphate, etc.)

They also include developing solutions in which water is added to the above-mentioned organic solvent developing solutions, developing solutions in which the above-mentioned organic solvents are solubilized in water by use of surfactants, etc., developing solutions in which alkali agents (for example, sodium carbonate, diethanolamine and sodium hydroxide) are further added thereto, and only water (such as tap water, pure water and distilled water).

The development can be conducted by known methods such as rubbing of plate faces with developing pads containing the developing solutions as described above, and rubbing of plate faces with developing brushes after pouring of the developing solutions on the plate faces. The temperature of the developing solutions can be arbitrarily selected, but is preferably 10° C. to 50° C. This removes the ink-repellent layers of the image areas to convert the areas to ink-receiving areas.

When the printing plates thus treated are stored in piles, guard sheets are preferably inserted therebetween to protect the printing plates.

The development processing as described above, and the subsequent washing and drying can be conducted with an automatic processor. A preferred example of such an automatic processor is described in JP-A-2-220061.

In the waterless printing plate of the present invention, it is also possible to laminate surfaces of the silicone rubber layer with an adhesive layer, followed by separation of the adhesive layer to conduct development. Any known adhesive layers can be used as long as they can be adhered to the surface of the silicone rubber layer. Products in which the flexible support is provided with an adhesive layer are commercially available, for example, in the trade name of "Scotch Tape #851A" manufactured by Sumitomo 3M Ltd.

The present invention will be illustrated in greater detail with reference to examples below, but these are not to be construed as limiting the invention.

EXAMPLES 1 TO 8 AND COMPARATIVE EXAMPLES 1 AND 2

Support

A gelatin undercoat layer is formed as a primer layer on a polyethylene terephthalate film having a thickness of 175 μm so as to give a dry film thickness of 0.2 μm.

Preparation of Carbon Black Dispersion

The following mixed solution was dispersed with a paint shaker for 30 minutes, and then, the glass beads were filtered off to prepare a carbon black dispersion.

| | |
|---|---|
| Carbon Black (#40 manufactured by Mitsubishi Carbon Co.) | 5.0 g |
| Crisvon 3006LV (polyurethane manufactured by Dainippon Ink and Chemicals, Inc.) | 4.0 g |
| Nitrocellulose (containing 30% of n-propanol) | 1.3 g |
| Solsperse S27000 (manufactured by ICI) | 0.4 g |
| Propylene Glycol Monomethyl Ether | 45 g |
| Glass Beads | 160 g |

Formation of Light-Heat Conversion Layer

The above-mentioned polyethylene terephthalate film undercoated with gelatin was coated with the following coating solution so as to give a dry film thickness of 2 μm, thereby forming a light-heat conversion layer.

| | |
|---|---|
| Carbon Black Dispersion Described Above | 55 g |
| Polymeric Compound shown in Table 1 | 6.0 g |
| Propylene Glycol Monomethyl Ether | 45 g |

Formation of Silicone Rubber Layer

The following coating solution was coated on the above-mentioned light-heat conversion layer, heated at 110° C. for 1 minute, and dried, thereby forming an addition type silicone rubber layer having a dry film thickness of 2 μm.

| | |
|---|---|
| α, ω-Divinylpolydimethylsiloxane (the degree of polymerization: about 700) | 9.00 g |
| $(CH_3)_3$—Si—O—$(SiH(CH_3)$—O$)_8$—Si$(CH_3)_3$ | 0.60 g |
| Polydimethylsiloxane (the degree of polymerization: about 8000) | 0.50 g |
| Olefin-Chloroplatinic Acid | 0.08 g |
| Inhibitor [HC≡C—C$(CH_3)_2$—O—Si$(CH_3)_3$] | 0.07 g |
| Isoper G (manufactured by Esso Kagaku Co.) | 55 g |

A polyethylene terephthalate film having a thickness of 6 μm is laminated on the surface of the silicone rubber layer obtained above.

TABLE 1

| Sample | Polymeric Compound (numerals indicate copolymerization molar ratios) |
|---|---|
| Example 1 | $-(CH_2C(CH_3)(COOCH_2CH=CH_2))_{80}-(CH_2C(CH_3)(COOH))_{20}-$ |
| Example 2 | $-(CH_2C(CH_3)(COOC_2H_4OCH_2CH=CH_2))_{86}-(CH_2C(CH_3)(COOC_2H_4OCOC_2H_4COOH))_{15}-$ |
| Example 3 | $-(CH_2CH(COOCH_2CH=CH_2))_{70}-(CH_2CH(COOC_4H_9))_{30}-$ |
| Example 4 | $-(CH_2C(CH_3)(COOC_2H_4OCOCH_2CH=CH_2))_{80}-(CH_2CH(CONHC_3H_2))_{20}-$ |
| Example 5 | $-(CH2CH(CONHC_2H_4OCH_2CH=CH_2))_{70}-(CH_2CH(C_8H_5))_{30}-$ |
| Example 6 | $-(CH_2C(CH_3)(COOCH_3CH=CH_2))_{75}-(CH_2CH(COOC_4H_9))_{20}-(CH_2C(CH_3)(COOC_3H_4OH))_{5}-$ |
| Example 7 | $-(CH_{2CH}(CONHC_2H_4OCOCH=CH_2))_{86}-(CH2C(CH_3)(COO(CH_2CH_2O)_9CH_3))_{15}-$ |
| Example 8 | $-(CH_2CH(C_8H_4CH_2NHCH_2CH=CH_2))_{75}-(CH_2C(CH_3)(COOCH_3))_{26}-$ |
| Comparative Example 1 | Crisvon 3006LV |
| Comparative Example 2 | $-(CH_2CH(COOC_4H_9))_{100}-$ |

After separation of the polyethylene terephthalate film from the resulting waterless printing plate of the present invention, a continuous line was written by use of a semiconductor-excited YAG laser having a wavelength of 1064 nm and a beam diameter of 100 $\mu$m (1/e$^2$). The recording energy was 0.75 J/cm$^2$. Then, the plate face was rubbed with a developing pad impregnated with isopropanol to remove the silicone rubber layer of a laser-exposed area. On the other hand, the silicone layer at the area not irradiated with the laser beam was not removed, and maintained on the surface of the waterless printing plate. Thus, a silicone image having sharp edges was obtained.

Further, writing was conducted on the waterless printing plate by use of a semiconductor laser having a power on a plate of 110 mW, a wavelength of 825 nm and a beam diameter of 10 $\mu$m (1/e$^2$), at a main operation speed of 6 m/second, followed by similar development. The resolving power was 8 $\mu$m, and a waterless lithographic printing plate having sharp edges was formed. Halftone dot formation of 200 lines was conducted under these recording conditions. As a result, a halftone dot area rate of 2% to 98% could be formed on the plate. A line was written on the non-image area of the resulting waterless printing plate with a 0.25-mm sapphire needle under a load of 100 g by use of a HEIDON unit (manufactured by Shinto Scientific Co., Ltd.) to evaluate the scratch resistance of the silicone rubber layer. The waterless lithographic printing plate thus formed was printed by use of a printer, thereby obtaining 20,000 good prints free from scum.

On the other hand, writing was conducted on each of the waterless printing plates of Comparative Examples 1 and 2 by use of the semiconductor-excited YAG laser and the semiconductor laster in the same manner as in Examples 1 to 8, followed by similar development. However, this printing plate showed various disadvantages such as blurred edges of an image formed on the waterless printing plate as a recording image and an increase in image area because of removal of the silicone at the edge portions with the progress of printing. Further, halftone dot formation of 200 lines results in only a halftone dot area rate of 4% to 96% in the half dot form with a fringe remained.

Furthermore, the scratch resistance was evaluated in the same manner as in Examples 1 to 8. As a results, ink adhered to an area scratched in printing to form a scum.

EXAMPLES 9 TO 13 AND COMPARATIVE EXAMPLES 3 AND 4

Support

A gelatin undercoat layer is formed as a primer layer on a polyethylene terephthalate film having a thickness of 175 μm so as to give a dry film thickness of 0.2 μm.

Formation of Light-Heat Conversion Layer

The following mixed solution was dispersed with a paint shaker for 30 minutes, and then, the glass beads were filtered off to prepare a coating solution for a light-heat conversion layer. This coating solution was coated on the above-mentioned primer layer so as to give a dry film thickness of 2 μm, thereby forming a light-heat conversion layer.

| | |
|---|---|
| Carbon Black (#MA100 manufactured by Mitsubishi Carbon Co. | 4.0 g |
| Nigrosine | 2.0 g |
| Nippollan 2304 (polyurethane manufactured by Nippon Polyurethane Industry Co., Ltd.) | 2.0 g |
| Solsperse S20000 (manufactured by ICI) | 0.27 g |
| Solsperse S12000 (manufactured by ICI) | 0.22 g |
| Polymeric Compound Shown in Table 2 | 6.0 g |
| Propylene Glycol Monomethyl Ether | 100 g |
| Glass Beads | 160 g |

Formation of Silicone Rubber Layer

The following coating solution was prepared, applied to the light-heat conversion layer on the support sheet, heated at 110° C. for 1 minute, and dried, thereby forming a condensation type silicone rubber layer having a dry film thickness of 2 μm.

| | |
|---|---|
| Dimethylpolysiloxane Having Hydroxyl Groups at Both Ends (the degree of polymerization: about 700) | 9.00 g |
| Methyltriacetoxysilane | 0.3 g |
| Dibutyltin Dioctanate | 0.2 g |
| Isoper G (manufacturod by Esso Kagaku Co.) | 160 g |

A 6-μm thick polyethylene terephthalate film was laminated on the surface of the silicone rubber layer obtained above.

TABLE 2

| Sample | Polymeric Compound (numerals indicate copolymerization molar ratios) |
|---|---|
| Example 9 | $-(CH_2C)_{\overline{100}}-$ with CH$_3$ above and COOC$_2$H$_4$OH below |
| Example 10 | $-(CH_2C)_{\overline{86}}-$ with CH$_3$ above and COOC$_2$H$_4$OH below; $-(CH_2CH)_{\overline{16}}-$ with COOC$_4$H$_9$ below |
| Example 11 | $-(CH_2CH)_{\overline{70}}-$ with COOC$_2$H$_4$OH below; $-(CH_2C)_{\overline{30}}-$ with CH$_3$ above and COOCH$_3$ below |
| Example 12 | $-(CH_2C)_{\overline{80}}-$ with CH$_3$ above and COOC$_2$H$_4$OC$_2$H$_4$OH below; $-(CH_2CH)_{\overline{20}}-$ with CONHC$_4$H$_9$ below |
| Example 13 | $-(CH_2CH)_{\overline{70}}-$ with C$_5$H$_4$C$_2$H$_4$OH below; $-(CH_2CH)_{\overline{30}}-$ with C$_5$H$_5$ below |
| Comparative Example 3 | Nippollan 2304 |
| Comparative Example 4 | $-(CH_2CH)_{\overline{100}}-$ with COOC$_4$H$_9$ below |

After separation of the polyethylene terephthalate film from the resulting waterless printing plate of the present invention, a continuous line was written by use of a semiconductor-excited YAG laser having a wavelength of 1064 nm and a beam diameter of 100 μm ($1/e^2$). The recording energy was 0.75 J/cm$^2$. Then, the plate face was rubbed with a developing pad impregnated with isopropanol to remove the silicone rubber layer of the laser-exposed area. On the other hand, the silicone layer at the area not irradiated with the laser beam was not removed, and maintained on the surface of the waterless printing plate. Thus, a silicone image having sharp edges was obtained.

Further, writing was conducted on the waterless printing plate by use of a semiconductor laser having a power on a plate of 110 mW, a wavelength of 825 nm and a beam diameter of 10 μm ($1/e^2$), at a main operation speed of 6 m/second, followed by similar development. The resolving power was 9 μm, and a waterless lithographic printing plate having sharp edges was formed. Halftone dot formation of 200 lines was conducted under these recording conditions. As a result, a halftone dot area rate of 2% to 98% could be formed on the plate. A line was written on the non-image area of the resulting waterless printing plate with a 0.25-mm sapphire needle under a load of 100 g by use of a HEIDON unit (manufactured by Shinto Scientific Co., Ltd.) to evaluate the scratch resistance of the silicone rubber layer. The waterless lithographic printing plate thus formed was printed by use of a printer, thereby obtaining 20,000 good prints free from scum.

On the other hand, writing was conducted on each of the waterless printing plates of Comparative Examples 3 and 4 by use of the semiconductor-excited YAG laser and the semiconductor laser in the same manner as in Examples 9 to 13, followed by similar development. However, this printing plate showed various disadvantages such as blurred edges of an image formed on the waterless printing plate as a recording image and an increase in image area because of removal of the silicone at the edge portions with the progress of printing. Further, halftone dot formation of 200 lines results in only a halftone dot area rate of 4% to 96% in the half dot form with a fringe remained.

Furthermore, the scratch resistance was evaluated in the same manner as in Examples 9 to 13. As a result, ink adhered to the area scratched in printing to form a scum.

EXAMPLE 14

Support

A coating solution having the following composition was coated on a 0.24-mm thick aluminum support so as to give a dry film thickness of 1 μm, heated at 100° C. for 1 minute, and dried, thereby forming a primer layer.

| | |
|---|---:|
| Sanprene IB1700D (polyurethane manufactured by Sanyo Chemical Industries Ltd.) | 10 g |
| Hexafluorophosphate of Condensation Polymerization Product of p-Diazodiphenylamine and Paraformaldehyde | 0.1 g |
| Defenser MCF323 (surfactant manufactured by Dainippon Ink and Chemicals, Inc.) | 0.03 g |
| Propylene Glycol Methyl Ether Acetate | 50 g |
| Methyl Lactate | 20 g |
| Pure Water | 1 g | of an FT26IV UDNS ULTRA-PLUS FLIPTOP PLATE MAKER vacuum exposing device manufactured by Nu Arc Company.

Formation of Light-Heat Conversion Layer

The following mixed solution was dispersed with a paint shaker for 30 minutes, and then, the glass beads were filtered off to prepare a coating solution for a light-heat conversion layer. This coating solution was coated on the above-mentioned primer layer so as to give a dry film thickness of 2 μm, thus forming a light-heat conversion layer.

| | |
|---|---:|
| Carbon Black (#40 manufactured by Mitsubishi Carbon Co.) | 50 g |
| Nippollan 2304 (polyurethane manufactured by Nippon Polyurethane Industry Co., Ltd.) | 3.0 g |
| Solsperse S20000 (manufactured by ICI) | 0.27 g |
| Solsperse S12000 (manufactured by ICI) | 0.22 g |
| Nitrocellulose (containing 30% of n-propanol) | 2.2 g |
| Allyl Methacrylate/Butyl Acrylate Copolymer (80/20 in molar ratio) | 5.0 g |
| Tetrahydrofuran | 100 g |
| Glass Beads | 160 g |

Formation of Silicone Rubber Layer

The following coating solution was coated on the above-mentioned light-heat conversion layer, heated on 110° C. for 1 minute and dried, thereby forming an addition type silicone rubber layer having a dry film thickness of 2 μm.

| | |
|---|---:|
| α, ω-Divinylpolydimethylsiloxane (the degree of polymerization: about 700) (CH$_3$)$_3$—Si—O—(SiH(CH$_3$)—O)$_8$—Si(CH$_3$)$_3$ | 9.00 g |
| | 0.60 g |
| Polydimethylsiloxane (the degree of polymerization: about 8000) | 0.50 g |
| Olefin-Chloroplatinic Acid | 0.08 g |
| Inhibitor [HC≡C—C(CH$_3$)$_2$—O—Si(CH$_3$)$_3$] | 0.07 g |
| Isoper G (manufactured by Esso Kagaku Co.) | 55 g |

A polyethylene terephthalate film having a thickness of 6 μm was laminated on the surface of the silicone rubber layer obtained above.

After separation of the polyethylene terephthalate film from the resulting waterless printing plate, a continuous line was written by use of a semiconductor-excited YAG laser having a wavelength of 1064 nm and a beam diameter of 100 μm (1/e$^2$). The recording energy was 0.75 J/cm$^2$. Then, a surface of the silicone rubber layer was laminated with Scotch Tape #851A manufactured by Sumitomo 3M Ltd, which was then removed to remove the silicone rubber layer at the laser-exposed area. On the other hand, the silicone layer at the area not irradiated with the laser beam was not removed, and maintained on the surface of the waterless printing plate. Thus, a silicone image having sharp edges was obtained.

Further, writing was conducted on the waterless printing plate by use of a semiconductor laser having a power on a plate of 110 mW, a wavelength of 825 nm and a beam diameter of 10 μm (1/e$^2$), at a main operation speed of 6 m/second, and similarly processed to remove the silicone rubber layer on the laser-exposed area. The laser recording sensitivity was 200 mJ/cm$^2$ and the resolving power was 8 μm. A waterless lithographic printing plate having sharp edges was formed. Halftone dot formation of 200 lines was conducted under these recording conditions. As a result, a halftone dot area rate of 2% to 98% could be formed on the plate.

Furthermore, a line was written on the non-image area of the resulting waterless printing plate with a 0.25-mm sapphire needle under a load of 100 g by use of a HEIDON unit (manufactured by Shinto Scientic Co., Ltd.) to evaluate the scratch resistance of the silicone rubber layer. The waterless lithographic printing plate thus formed was printed by use of a printer, thereby obtaining 80,000 good prints free from scum.

The waterless printing plates of the present invention are possible to conduct heat mode recording by laser beams, and are excellent in image reproducibility and scratch resistance.

While the invention has been described in detail with reference to specific embodiments, it will be apparent to one skilled in the art that various changes and modifications can be made to the invention without departing from its spirit and scope.

What is claimed is:

1. A lithographic printing plate precursor requiring no fountain solution comprising a support having provided thereon a light-heat conversion layer containing a compound capable of converting a laser beam to heat energy and a silicone rubber layer in this order, wherein the light-heat conversion layer contains a reaction product of an addition polymer having a group capable of reacting with a silicone crosslinking agent at a side chain of said addition polymer, said reaction product being formed by a reaction of the addition polymer with said silicone crosslinking agent, said crosslinking agent having been contained in the silicone rubber layer and said reaction product being formed when the silicone rubber layer is dried.

2. The lithographic printing plate precursor requiring no fountain solution of claim 1, wherein the addition polymer comprises a repeating unit represented by formula (1):

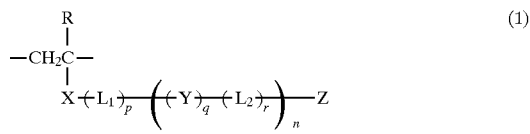

wherein R represents a hydrogen atom or a methyl group; X represents —COO—, —CONH— or a phenylene group; Y represents —COO—, —OCO—, —CONH—, —NHCO—, —NHCOO—, —OCONH—, —O—, —S—, —NH— or a phenylene group; L$_1$ and L$_2$ each represents an unsubstituted or substituted alkylene group having 1 to 20 carbon atoms;

Z represents a hydroxyl group, —CH=CH$_2$ or —C(CH$_3$)=CH$_2$; p, q and r each represents 0 or 1; and n represents an integer of 0 to 3.

3. The lithographic printing plate precursor requiring no fountain solution of claim 1, wherein the silicone rubber layer is formed from a composition comprising (a) 100 parts by weight of diorganopolysiloxane having a number average molecular weight of 3,000 to 40,000, (b) 3 to 70 parts by weight of a crosslinking agent that crosslinks by a condensation reaction, and (c) 0.01 to 40 parts by weight of a catalyst.

4. The lithographic printing plate precursor requiring no fountain solution of claim 1, wherein the silicone rubber layer is formed from a composition comprising (d) 100 parts by weight of diorganopolysiloxane having addition reactive functional groups and having a number average molecular weight of 3,000 to 40,000, (e) 0.1 to 10 parts by weight of organohydrogenpolysiloxane, and (f) 0.00001 to 1 parts by weight of an addition catalyst.

* * * * *